(12) United States Patent  
Bellato et al.

(10) Patent No.: US 7,320,617 B1
(45) Date of Patent: Jan. 22, 2008

(54) ELECTRICAL COUPLING APPARATUS AND METHOD

(75) Inventors: Stephen Bellato, Martinez, CA (US); Kenneth D. Karklin, San Francisco, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/460,277

(22) Filed: Jul. 27, 2006

(51) Int. Cl.
*H01R 12/24* (2006.01)

(52) U.S. Cl. .......................... 439/496; 439/67; 439/66; 439/91

(58) Field of Classification Search ................ 439/496, 439/495, 67, 66, 91
See application file for complete search history.

(56) References Cited

U.S. PATENT DOCUMENTS

| | | | | |
|---|---|---|---|---|
| 5,044,980 | A | * | 9/1991 | Krumme et al. ............ 439/496 |
| 5,123,852 | A | * | 6/1992 | Gillett .......................... 439/67 |
| 5,636,996 | A | * | 6/1997 | Johnson et al. ............... 439/66 |
| 6,017,244 | A | * | 1/2000 | Daane ........................ 439/495 |
| 6,368,147 | B1 | * | 4/2002 | Swanson .................... 439/496 |
| 6,497,583 | B1 | | 12/2002 | Weiss et al. |
| 6,649,115 | B2 | | 11/2003 | Weiss et al. |
| 6,702,587 | B2 | | 3/2004 | Weiss et al. |
| 6,755,683 | B2 | * | 6/2004 | Roberts et al. ............. 439/496 |
| 6,769,313 | B2 | | 8/2004 | Weiss |
| 6,802,720 | B2 | | 10/2004 | Weiss et al. |
| 6,835,072 | B2 | | 12/2004 | Simons et al. |
| 6,854,985 | B1 | | 2/2005 | Weiss |
| 6,929,484 | B2 | | 8/2005 | Weiss et al. |
| 7,017,260 | B2 | | 3/2006 | Weiss et al. |
| 7,059,874 | B2 | | 6/2006 | Weiss |
| 7,063,542 | B2 | | 6/2006 | Weiss et al. |

* cited by examiner

*Primary Examiner*—Gary Paumen

(57) ABSTRACT

Disclosed are various embodiments of electrical coupling apparatuses and methods. In one embodiment, an electrical coupling apparatus is provided having a first contact array on a card, where the first contact array is located at a first predefined position relative to an insertion edge of the card. The apparatus also includes a flexible printed circuit having a second contact array corresponding to the first contact array, where the second contact array is positioned in alignment with the first contact array. A compliant interposer material is positioned between the first and second contact arrays, the compliant interposer material electrically coupling respective pairs of contacts in the first and second contact arrays. Also, the insertion edge is configured to be inserted into a receptacle, the second contact array being positioned relative to the insertion edge so as to mate with a corresponding contact array in the receptacle when the insertion edge is inserted into the receptacle.

20 Claims, 8 Drawing Sheets

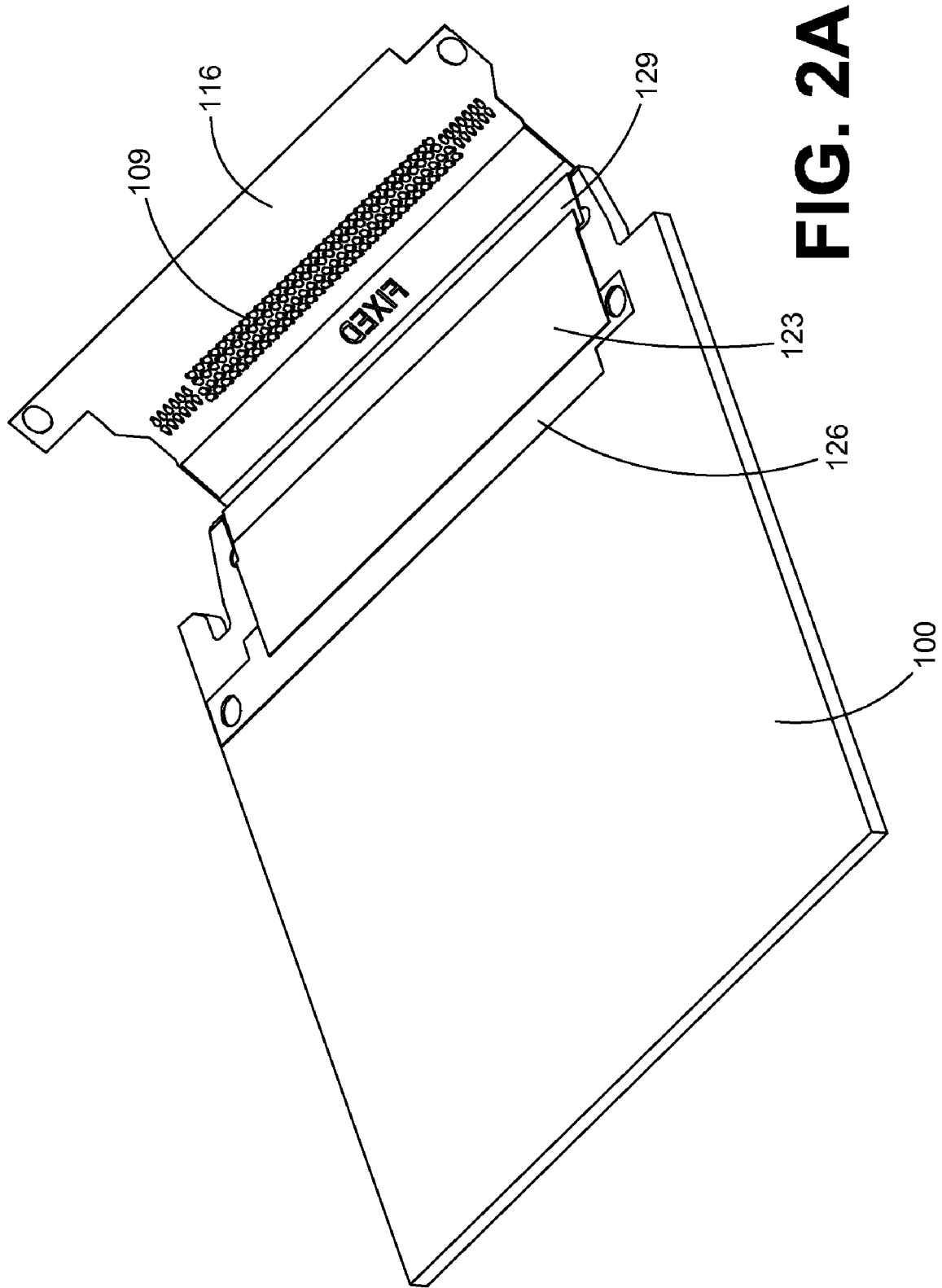

ELECTRICAL COUPLING APPARATUS AND METHOD

BACKGROUND

Electronic circuitry currently makes use of contact arrays that conduct multiple signals from integrated circuits and other devices to test equipment and the like. As the contact arrays get more dense, it becomes more difficult to electrically couple the respective contacts of two corresponding contact arrays to each other for proper operation without a fault or discontinuity. Significant cost may be incurred when such anomalies occur in attempting to correct for inadequate electrical contact between respective pairs of contacts in corresponding arrays.

SUMMARY

Embodiments of the present invention provide for various apparatuses and methods for electrical coupling contact arrays in a card edge with corresponding contact arrays in receptacles. In one embodiment, an apparatus is provided that includes a first contact array on a card, the first contact array being located at a first predefined position relative to an insertion edge of the card. The apparatus also includes a flexible printed circuit having a second contact array that corresponds to the first contact array, the second contact array being positioned in alignment with the first contact array. A compliant interposer material is positioned between the first and second contact arrays, the compliant interposer material electrically coupling respective pairs of contacts in the first and second contact arrays, wherein the insertion edge is configured to be inserted into a receptacle, the second contact array being positioned relative to the insertion edge so as to mate with a corresponding contact array in the receptacle when the insertion edge is inserted into the receptacle.

In another embodiment, a method is provided for electrical coupling a first contact array on a card with a corresponding contact array in a receptacle, wherein a flexible printed circuit includes a second contact array corresponding to the first contact array, the second contact array being in alignment with the first contact array, and wherein a compliant interposer material is positioned between the first and second contact arrays, the compliant interposer material electrically coupling respective pairs of contacts in the first and second contact arrays, the method comprising the steps of inserting an insertion edge of the card into the receptacle so as to mate the second contact array with the corresponding contact array in the receptacle, and conforming the second pad array to a topology of the corresponding contact array in the receptacle by virtue of a degree of compliance of the compliant interposer material.

In still another embodiment, an apparatus for electrical coupling is provide that comprises a first contact array on a card, the first contact array being located at a first predefined position relative to an insertion edge of the card, and a first means for positioning a second contact array adjacent to the first contact array, the second contact array corresponding to the first contact array, and the second contact array being positioned in alignment with the first contact array. The apparatus further comprises second means for adding a degree of compliance to the second contact array relative to the first contact array, wherein respective contacts in the first array are electrically coupled to corresponding contacts in the second contact array, and, wherein the insertion edge is configured to be inserted into a receptacle, the second contact array being positioned relative to the insertion edge so as to mate with a corresponding contact array in the receptacle when the insertion edge is inserted into the receptacle.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 2A and 2B are drawings of various views of the card of FIG. 1 according to an embodiment of the present invention;

DETAILED DESCRIPTION

Figure 1:
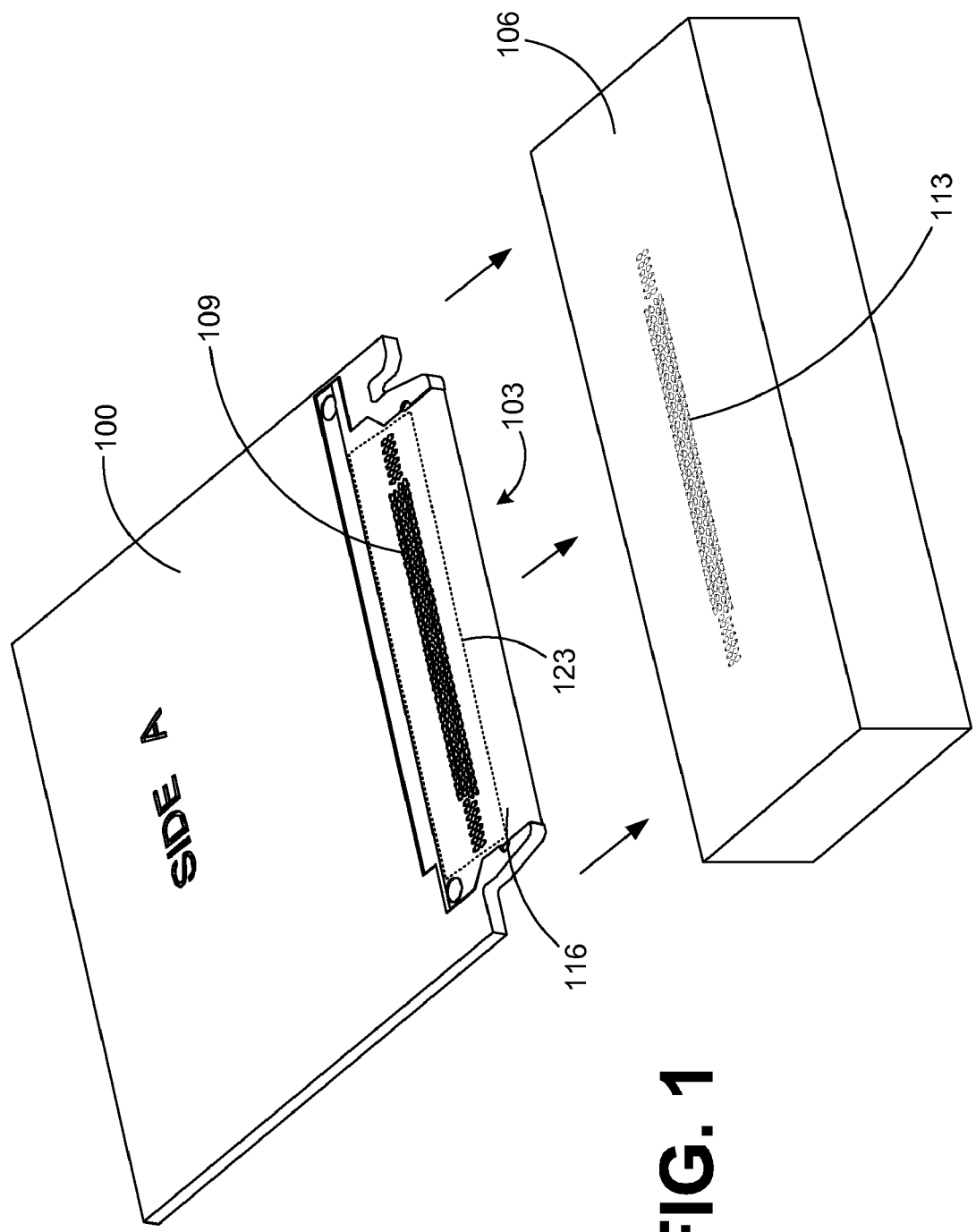
FIG. 1 is a drawing of a card having a circuit with a contact array that is compatible with a receptacle according to an embodiment of the present invention.

With reference to FIG. 1, shown is a card 100 having an insertion edge 103 that is inserted into a receptacle 106. The card 100 may be, for example, a printed circuit board or other device as can be appreciated. In this respect, a circuit comprising various electrical components may reside on the card 100. A contact array 109 that is electrically coupled to circuitry on the card 100 is located on the card 100 at a pre-defined position relative to an insertion edge 103 of the card 100. The insertion edge 103 of the card 100 comprises a portion of the card 100 that is inserted into the receptacle 106.

The receptacle 106 includes a contact array 113 that corresponds with the contact array 109. In this respect, the contact arrays 109 and 113 mate with each other such that respective pairs of contacts in the contact arrays 109 and 113 are electrically coupled to each other when the card 100 is inserted into the receptacle 106. According to one embodiment, the card 100 includes a second contact array on the side of the card opposite that upon which the contact array 109 appears. Thus, in one embodiment, the insertion edge 103 represents a male portion of a plug arrangement and the receptacle 106 represents a female portion the plug arrangement.

The contact array 109 is disposed on a flexible circuit 116. In one embodiment, the flexible circuit 116 wraps around the insertion edge 103. The contact array 109 is aligned with a contact array on the card 100 beneath the flexible printed circuit 116. In this respect, the contact array 109 corresponds to and is in alignment with the contact array beneath the flexible printed circuit 116. Thus, as contemplated herein, a first contact array "corresponds to" a second contact array in the sense that the arrangement of contacts of the first contact array substantially matches the arrangement of contacts in the second array such that respective pairs of contacts from both arrays line up with each other when the contact arrays are in alignment. Thus, in one embodiment, a pair of contact arrays correspond to each other when individual contacts of each array are spaced such that they can come into contact with each other if the two contact arrays were mated together.

In order to effect an electrical coupling between the contacts of the contact array 109 and the contacts of the contact array (not shown) disposed on the card 100 beneath the flexible printed circuit 116, a compliant interposer material 123 is positioned between the flexible printed circuit 116 and the card 100 so as to lie between the respective contact arrays. As a consequence, the client interposer material electrically couples respective pairs of contacts in the contact array 109 and a contact array (not shown) disposed on the card 100.

By virtue of the use of the client interposer material 123 between the contact array on the card 100 and contact array 109 on the flexible printed circuit 116, a degree of compliance is imparted to the contact array 109 such that the contact array 109 will mate up with the corresponding contact array 113 in the receptacle 106 in a more efficient and effective manner. In particular, the degree of compliance imparted to the contact array 109 on the flexible printed circuit 116 facilitates compliance of the contact array 109 relative to the contact array on the card 100 and/or the surface of the card 100 itself. This allows the second contact array 109 to conform to the topology of the contact array 113 with the receptacle 106 when the insertion edge 103 is inserted into the receptacle 106.

In addition, when the insertion edge 103 is inserted into the receptacle 106, the receptacle 106 may be configured to exert a force that compresses the insertion edge 103, thereby compressing the flexible printed circuit 116, the compliant interposer material 123, and the card 100 itself. In this respect, the compliant interposer material 123 acts like a spring that generates a counter force against the receptacle, thereby causing the second contact array 109 to conform to the topology of the contact array 113.

As contemplated herein, a "contact array" may comprise, for example, a pad array, pin array, or any other type of contact array that is capable of coupling to a second contact array through the complaint interposer material 123 as described herein.

The insertion edge 103 of the card 100 is configured for insertion into the receptacle 106. In this respect, the mechanical structure of the insertion edge 103 is constructed so as to be compatible with the receptacle 106 as can be appreciated.

Turning to FIG. 2A, shown is a view of the card 100 according to an embodiment of the present invention. The flexible printed circuit 116 is folded over to reveal the compliant interposer material 123 that is attached to the card 100 by way of adhesive 126 and 129. The adhesive 126 and 129 may be in the form of double sided tape, or other adhesives may be employed as can be appreciated. In other embodiments, the compliant interposer material 123 may be attached to the card 100 by way of a clamp or using some other attachment mechanism. The adhesive 129 lies within a recess at the edge of the card 100, although in alternative embodiments, the adhesive 129 may not lie with a recess.

The compliant interposer material 123 may comprise, for example, an anisotropic conductive elastomer such as that described U.S. Pat. No. 7,059,874 entitled "An Anisotropic Elastomer Based Electrical Interconnect With Enhanced Dynamic Range." Alternatively the compliant interposer material 123 may comprise other materials offered by manufacturers such as RedPeak, Shinitzu, and Diamond Dust. For example, the compliant interposer material 123 may comprise a Shinitzu connector material or other patterned elastomeric connector materials such as those used in integrated circuit contactors by SMB company of Korea.

Due to the fact that the flexible printed circuit 116 is folded over as depicted in FIG. 2A, the adhesive 126 and 129 is shown extending beyond the footprint of the client interposer material 123 so as to also contact the flexible printed circuit 116 when it is pressed in place against the card 100. Thus, the adhesive 126 and 129 facilitates attaching both the compliant interposer material 123 and the flexible printed circuit 116 to the card 100. Alternatively, some other fastener or fastening structure may be employed to attach the compliant interposer material 123 and/or the flexible printed circuit 116 to the card 100.

Figure 2B:
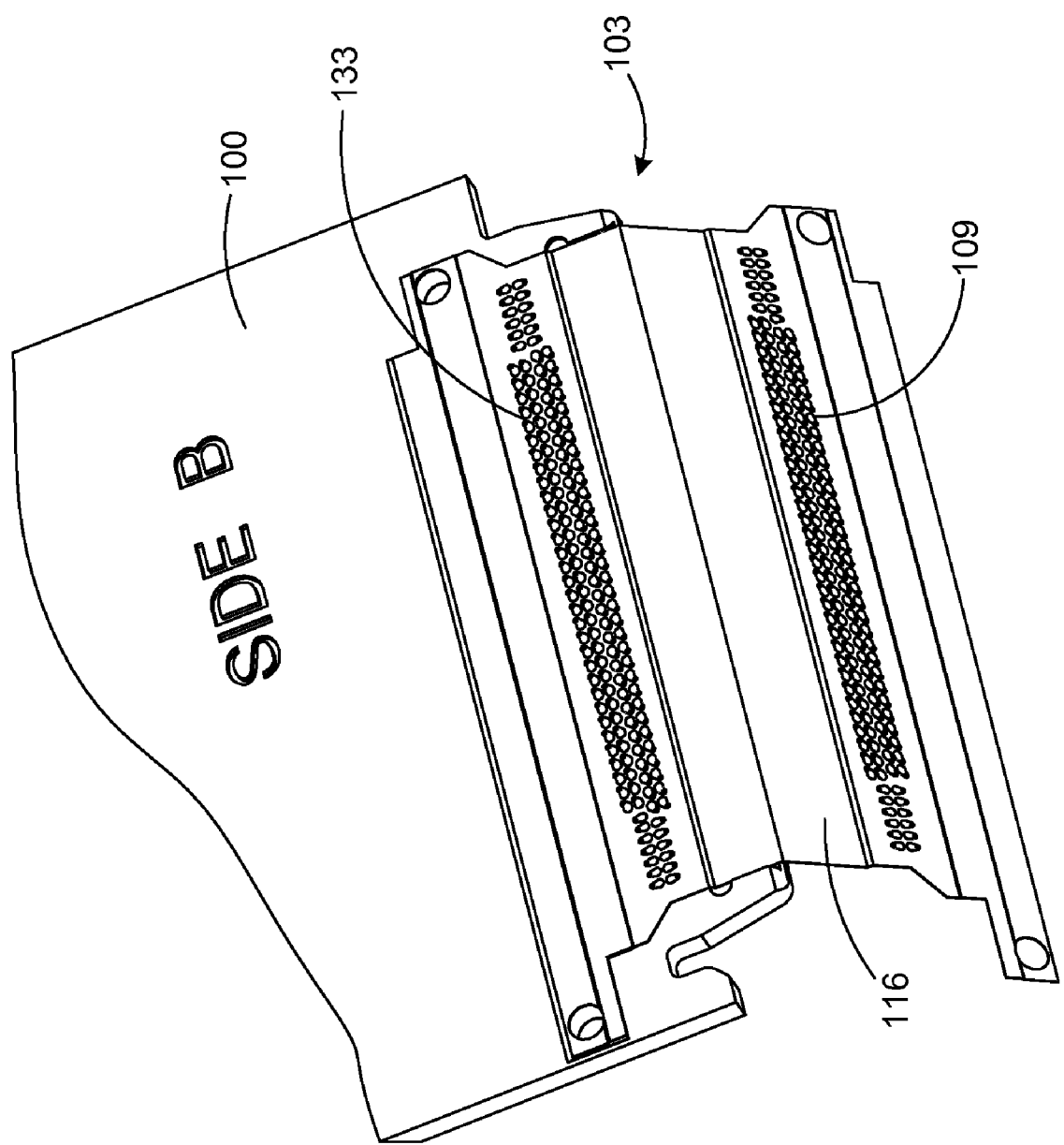

With reference to FIG. 2B, shown is a second side of the card 100 that is opposite the side depicted in FIG. 2A according to an embodiment of the present invention. The flexible printed circuit 116 is attached to the depicted side of the card 100, where the portion of the flexible printed circuit 116 dangles free as was depicted with respect to FIG. 2A. As such, the contact array 109 is depicted on the portion of the flexible printed circuit 116 that dangles free. In addition, another contact array 133 is disposed on the remaining portion of the flexible printed circuit 116 that is attached to the side of the card 100. According to one embodiment, the contact array 133 is aligned with and electrically coupled to a corresponding contact array disposed on the side of the card 100 depicted in FIG. 2B. In this respect, underneath the flexible printed circuit 116 attached to the side of the card 100 are structures similar to those depicted with respect to FIG. 2A.

Specifically, underneath the flexible printed circuit 116 is compliant interposer material 123 and adhesive 126/129 that holds the structures to the side of the card 100 in a manner similar to that described with reference to FIG. 2A. Thus, the structures on either side of the card 100 may be identical according to an embodiment of the present invention. Alternatively, the contact arrays on the respective sides of a card 100 may differ, where the contact arrays 109 and 133 may differ in the same manner so as to correspond with the respective contact arrays disposed on the respective sides of the card 100

By virtue of the fact that the flexible printed circuit 116 wraps around the insertion edge 103 of the card 100, the flexible printed circuit 116 helps reduce an application of a frictional force by a receptacle 106 (FIG. 1) to the compliant interposer material 123 when the insertion edge 103 is inserted into the receptacle 106. In this respect, the flexible printed circuit 116 covers the compliant interposer material 123 on either side of the card 100 and ensures that the compliant interposer material 123 is not subjected to rubbing caused by the insertion of the insertion edge 103 into the receptacle 106. This aids in preventing a dislodging of the compliant interposer material 123 from the card 100 and disrupting an electrical connections between contacts on the card 100 and on a respective side of the flexible printed circuit 116.

As an additional alternative, the receptacle 106 may comprise a zero insertion force receptacle such that no force is required to cause the insertion edge 106 to be inserted into the receptacle 106 as can be appreciated. In this respect there are many different designs of zero insertion force receptacles 106 that may be employed. As such, in another embodiment, it may not be necessary for the flexible printed circuit 103 to wrap around the insertion edge 104 of the card 100. Rather, the flexible printed circuit 116 may be attached as a component on respective sides of the card without wrapping around the edge 103. In this respect, the flexible printed circuit 116 would actually be two components, one attached to each respective side of the card 100. In this manner, the degree of compliance imparted to the contact arrays 109 or 133 by use of the respective compliant interposer materials 123 is maintained.

Figure 3:
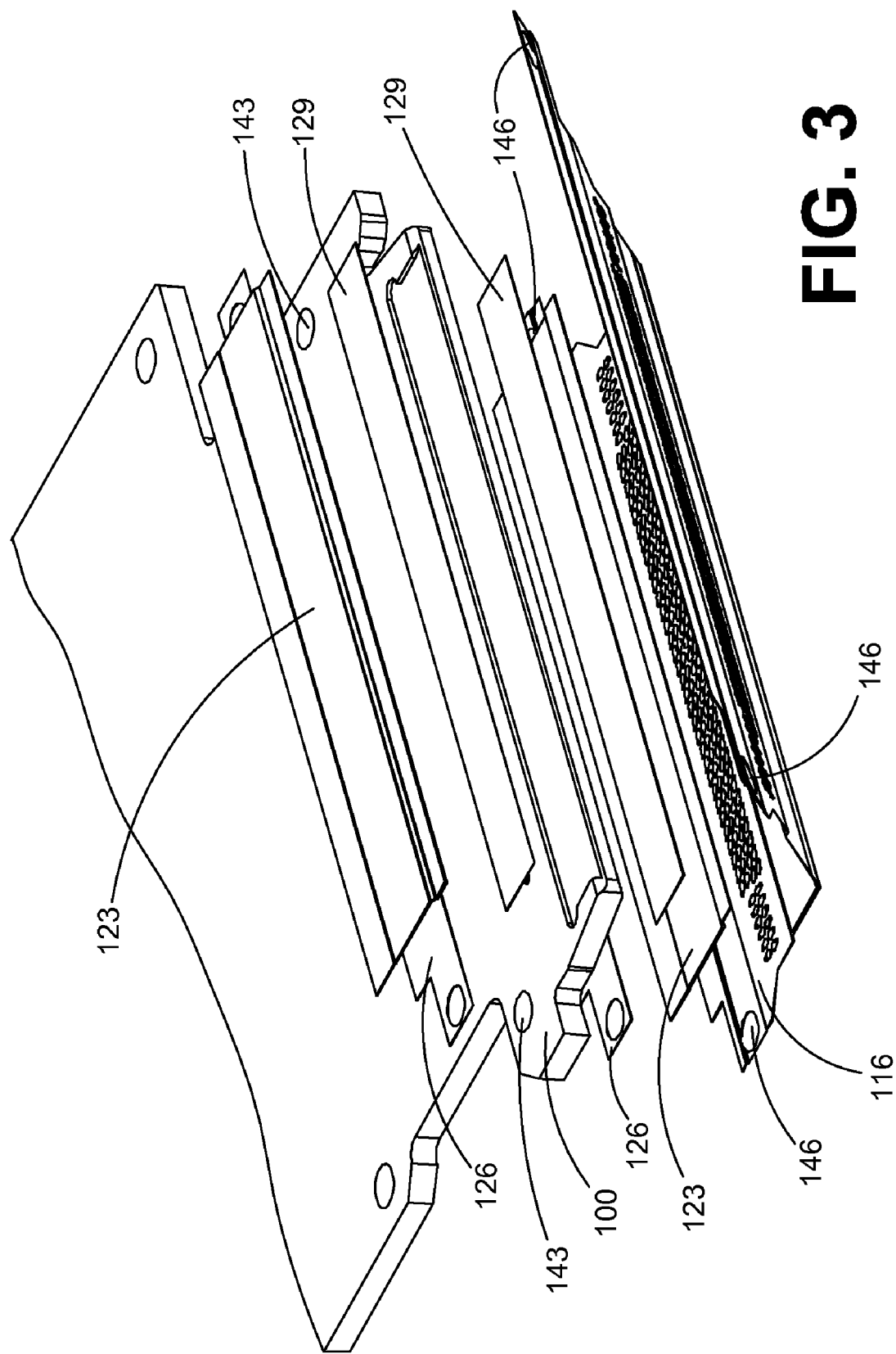
FIG. 3 is a drawing of an exploded view of an insertion edge assembly of the card of FIG. 1 according to an embodiment of the present invention.

Referring next to FIG. 3, shown is an exploded view of the insertion edge assembly according to various embodiments of the present invention. The adhesives 126 and 129 mate with the card 100, and the compliant interposer materials 123 are then attached to the adhesives 123, thereby attaching the interposer materials 123 to the card 100. Thereafter, the flexible printed circuit 116 is attached to one side of the card 100 and then folded over and attached to the other side of the card 100 by way of the adhesive 126 and 129.

In one embodiment, the card 100 comprises a structure that provides for positioning of the flexible printed circuit 116 relative to the card 100 itself. This facilitates alignment of the contact arrays 109 and/or 133 with the respective contact arrays on the card 100. In this respect, the proper alignment insures that respective pairs of contacts of the respective mated arrays are electrically coupled to each other through the compliant interposer materials 123. According to one embodiment, this structure comprises holes 143 that are aligned with holes 146 of the flexible printed circuit 116, thereby aligning the flexible printed circuit 116 with the card 100. The adhesive 126 also include holes in the case that the adhesive 126 comprises double sided tape so that the adhesive 126 does not impede the insertion of a pin or other device into the holes. In order to ensure that the holes 146 of the flexible printed circuit 116 are aligned with the holes 143 in the card 100, a pin or other alignment device may be inserted through the respective holes that mate with each other.

Figure 4A:
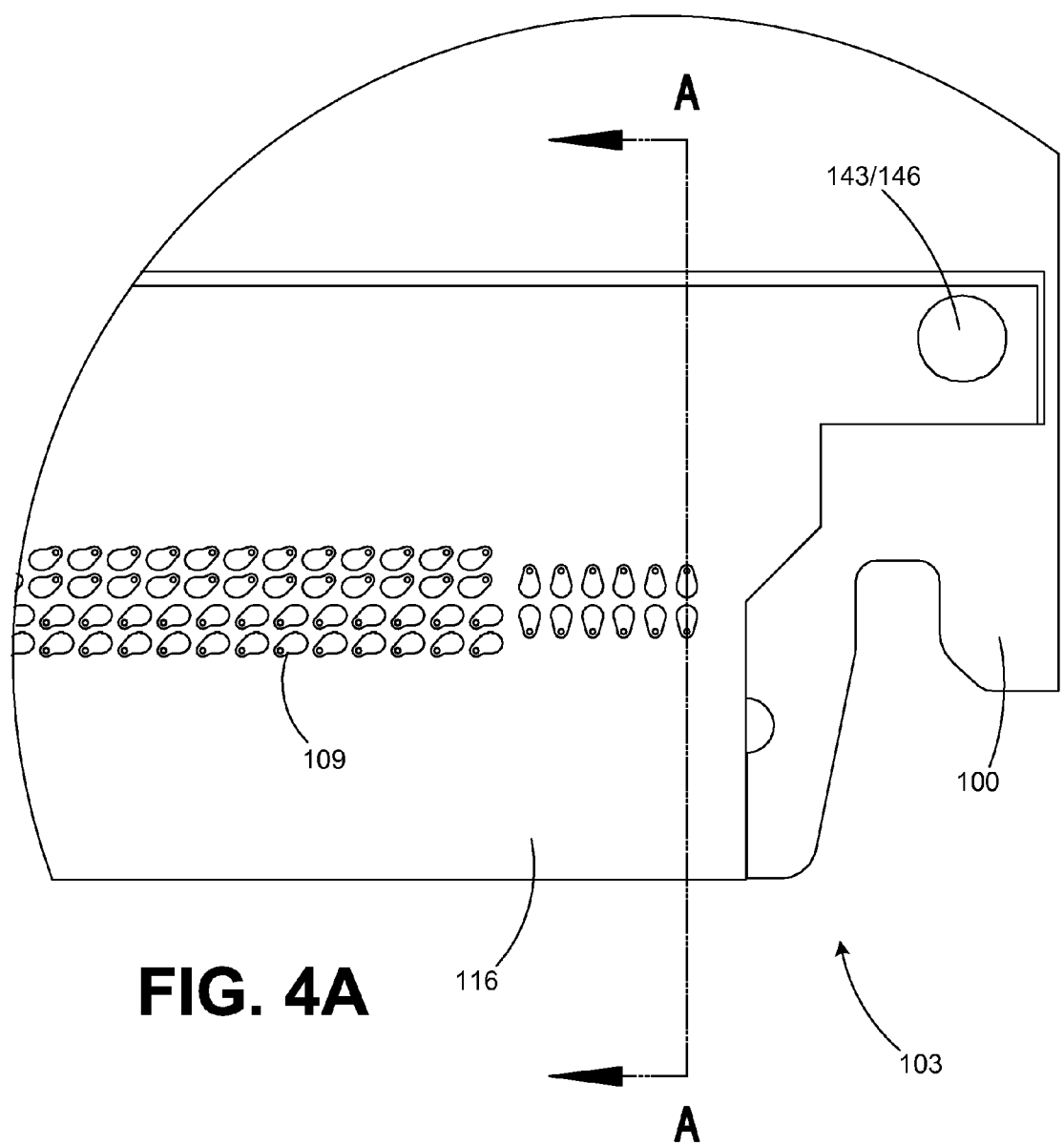
FIGS. 4A and 4B are drawings of a portion of the insertion edge assembly and a sectional view of a portion of the insertion edge assembly of the card of FIG. 1 according to an embodiment of the present invention.
Figure 4B:
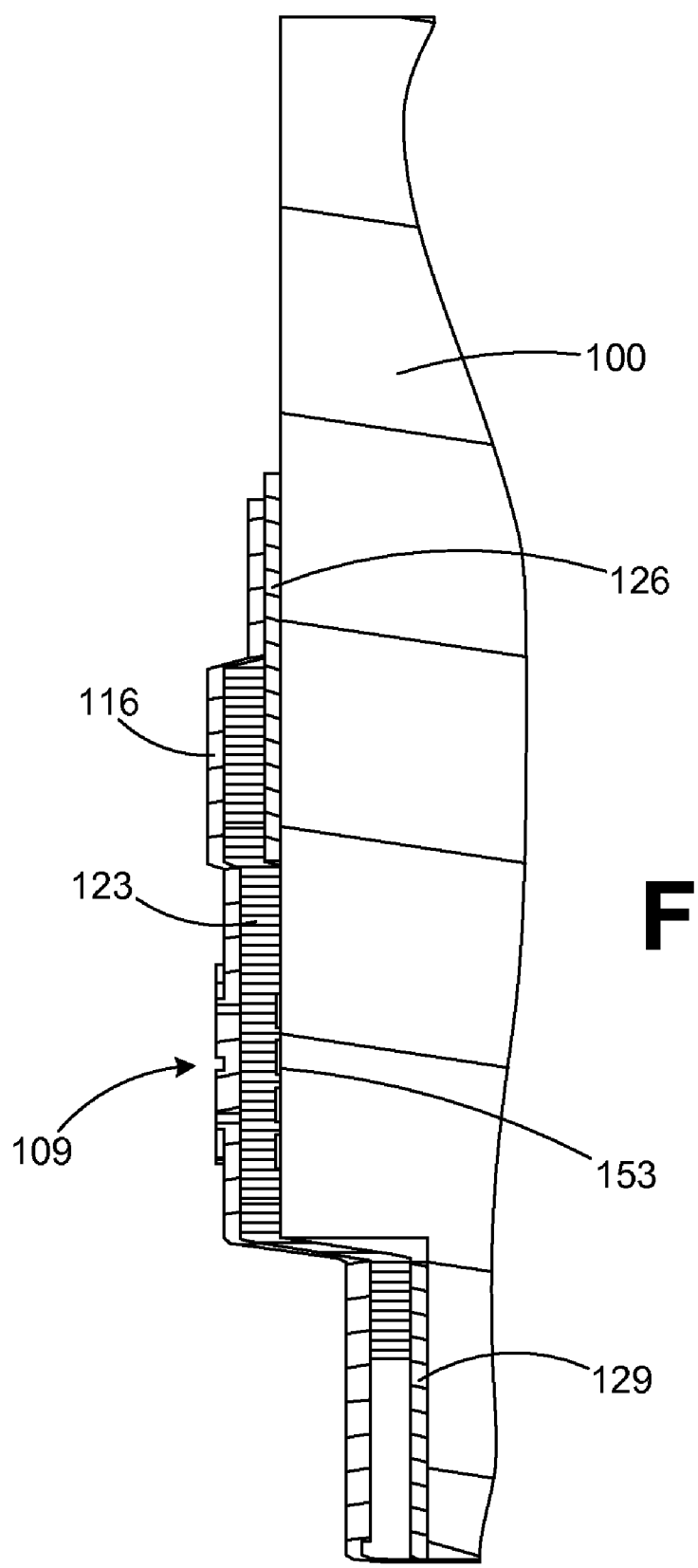

Referring next to FIGS. 4A and 4B, shown is a portion of the insertion end assembly with a partial section view of the insertion end assembly depicted in FIG. 4B according to an embodiment of the present invention. The partial section view depicts the flexible printed circuit 116 disposed adjacent to the compliant interposer material 123. The compliant interposer material 123 is exposed to the adhesive 126 and 129 that are, in turn, attached to the board 100. In addition, disposed on the board 100 under the contact array 109 is a contact array 153 that exists on the board 100 as was described above. The contact array 153 is thus adjacent to the contact array 109 on the flexible printed circuit 116, with the compliant interposer material 123 therebetween.

The contact array 109 is in alignment with the contact array 153 such that respective pairs of contacts in the arrays 109 and 153 are electrically coupled to each other as described above. The holes 143 and 146 in the board 100 and the flexible printed circuit 116 are in alignment as depicted with respect to FIG. 4A. In this respect, the holes 143/146 facilitate the alignment as a pin may be inserted through the respective holes 143/146, thereby aiding in the alignment of the flexible printed circuit 116 with the card 100. This in turn insures that the respective pairs of contact arrays to be mated through the respective compliance interposer materials 123 are in proper alignment as described above.

Figure 5:
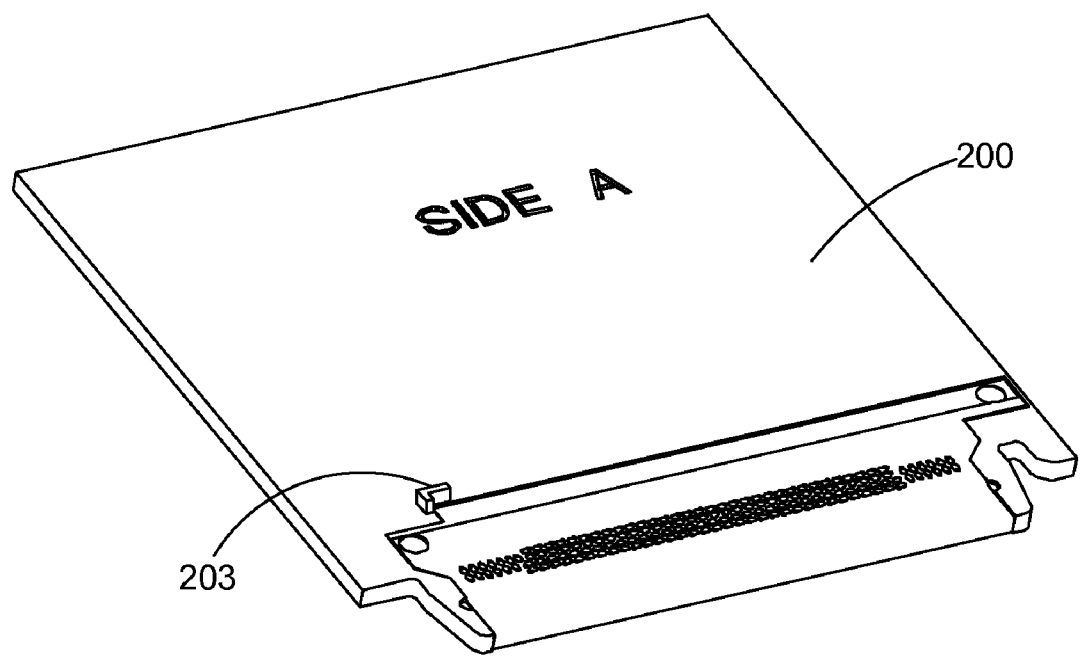
FIG. 5 is a drawing of another embodiment of a card that mates with the receptacle of FIG. 1 according to another embodiment of the present invention.

With reference to FIG. 5, shown is a card 200 according to an embodiment of the present invention that includes a projection structure 203 that facilitates alignment of the flexible printed circuit 116 with the card 200 when the flexible printed circuit 116 is attached to the card 200. In this respect, the projection 203 may present corners, flat surfaces, or other types of shapes against which the flexible printed circuit 116 may abut when attaching the flexible printed circuit 116 to the card 200 to insure alignment between the respective contact arrays 109 and 153 as described above. In this respect, the flexible printed circuit 116 is positioned relative to these projections 203 to insure proper alignment.

Figure 6A:
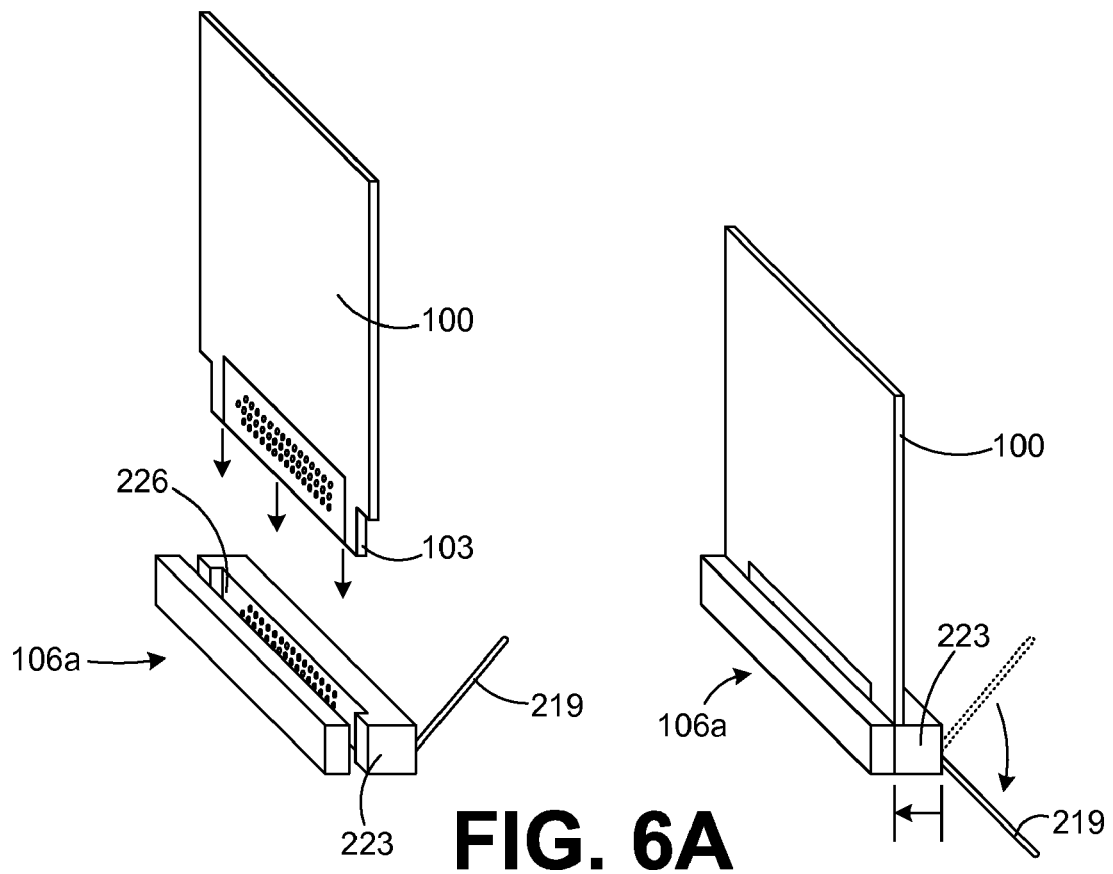
FIGS. 6A and 6B are drawings that illustrate various examples the receptacle of FIG. 1 according to another embodiment of the present invention.

Referring next to FIG. 6A, shown is an illustration of the card 100 as it is inserted into a receptacle 106a according to an embodiment of the present invention. The receptacle 106a is a zero-insertion force (ZIF) female receptacle. A lever 219 may be actuated on the receptacle 106a to cause a moveable portion 223 to clamp the insertion edge 103 of the card 100 as shown. In order to mate the contact array 109 on one or both sides of the card 100 with corresponding contact arrays 113 in the receptacle 106a, the insertion edge 103 is inserted into the open gap 226 and the lever 219 is pushed downward, thereby clamping the insertion edge 103 in the receptacle 106a and mating the contacts of the respective contact arrays 109/113. Given that the complaint interposer material 123 introduces a degree of compliance with respect to the contact array 109 as described above, the corresponding contact array(s) in the receptacle 106a do not need to be significantly compliant. This is because the degree of compliance imparted to the one or more contact arrays 109 allows the contact arrays 109 to conform to the topology of a corresponding contact array in the receptacle 106a.

Figure 6B:
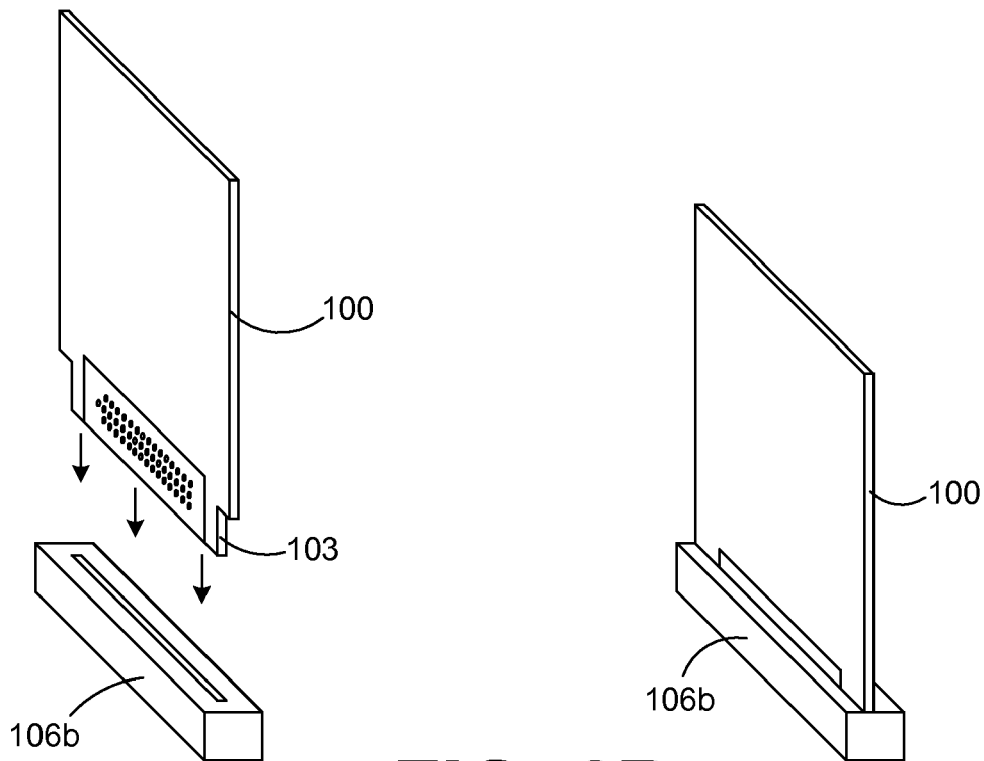

With reference then to FIG. 6B, shown is an illustration of the card 100 as it is inserted into a receptacle 106b according to yet another embodiment of the present invention. Unlike the receptacle 106a (FIG. 1), the receptacle 106b is not a zero-insertion force (ZIF) female receptacle. The receptacle 106b is a fixed female receptacle such as a Peripheral Component Interconnect (PCI) connector as can be appreciated. As a consequence, an amount of friction is created between the receptacle 106b and the insertion edge 103 when the insertion edge 103 is inserted into the receptacle 106b as shown. However, this friction does not harm or dislodge the complaint interposer material 123 due to the fact that the flexible circuit 116 covers the compliant interposer material 123 as described above. Given that the complaint interposer material 123 introduces the degree of compliance with respect to the contact array 109 as described above, the corresponding contact array(s) in the receptacle 106b do not need to be significantly compliant.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included Therefore, having thus described the invention, at least the following is claimed:

1. An apparatus for electrical coupling, comprising:
   a first contact array on a card, the first contact array being located at a first predefined position relative to an insertion edge of the card;
   a flexible printed circuit having a second contact array that corresponds to the first contact array, the second contact array being positioned in alignment with the first contact array;
   a compliant interposer material positioned between the first and second contact arrays, the compliant interposer material electrically coupling respective pairs of contacts in the first and second contact arrays; and
   wherein the insertion edge is configured to be inserted into a receptacle, the second contact array being positioned relative to the insertion edge so as to mate with a corresponding contact array in the receptacle when the insertion edge is inserted into the receptacle.

2. The apparatus of claim 1, wherein the flexible circuit board wraps around the insertion edge, thereby reducing an application of a frictional force by the receptacle to the compliant interposer material when the insertion edge is inserted into the receptacle.

3. The apparatus of claim 2, further comprising:
   the first contact array being disposed on a first side of the card;
   a third contact array on the card, the third contact array being located at a second predefined position relative to the insertion edge of the card, the third contact array being disposed on a second side of the card;
   a fourth contact array on the flexible printed circuitry that corresponds to the third contact array, the fourth contact array being positioned in alignment with the third contact array; and
   a second sheet of compliant interposer material positioned between the third and fourth contact arrays, the second sheet of compliant interposer material electrically coupling respective pairs of contacts in the third and fourth contact arrays.

4. The apparatus of claim 1, wherein the insertion edge is configured to be inserted into the receptacle with zero insertion force, the receptacle being a zero insertion force (ZIF) receptacle.

5. The apparatus of claim 1, wherein the compliant interposer material and the flexible printed circuit are attached to the card using an adhesive.

6. The apparatus of claim 1, wherein the compliant interposer material and the flexible printed circuit are attached to the card using at least one adhesive strip.

7. The apparatus of claim 1, wherein the compliant interposer material introduces a degree of compliance in the second contact array relative to the first contact array that allows the second contact array to conform to a topology of the corresponding contact array in the receptacle when the insertion edge is inserted into the receptacle.

8. The apparatus of claim 1, wherein the card further comprises a structure that provides for positioning of the flexible printed circuit relative to the card, thereby facilitating alignment of the second contact array with the first contact array.

9. The apparatus of claim 8, further comprising:
   the structure further comprising at least two first holes;
   the flexible printed circuit includes at least two second holes; and
   wherein a pin is insertable through respective pairs of the first and second holes, thereby aligning the flexible printed circuit with the card.

10. The apparatus of claim 8, wherein the structure further comprises a projection extending from a side of the card, wherein the flexible printed circuit is positioned relative to the projection.

11. The apparatus of claim 1, wherein the first contact array is a pad array.

12. An method for electrical coupling a first contact array on a card with a corresponding contact array in a receptacle, wherein a flexible printed circuit includes a second contact array corresponding to the first contact array, the second contact array being in alignment with the first contact array, and wherein a compliant interposer material is positioned between the first and second contact arrays, the compliant interposer material electrically coupling respective pairs of contacts in the first and second contact arrays, the method comprising the steps of:
   inserting an insertion edge of the card into the receptacle so as to mate the second contact array with the corresponding contact array in the receptacle; and
   conforming the second pad array to a topology of the corresponding contact array in the receptacle by virtue of a degree of compliance of the compliant interposer material.

13. The method of claim 12, wherein the flexible circuit board wraps around the insertion edge, the method further comprising the step of reducing an application of a frictional force by the receptacle to the compliant interposer material when the insertion edge is inserted into the receptacle.

14. The method of claim 12, wherein the insertion edge of the card is inserted into the receptacle with zero insertion force.

15. The method of claim 12, further comprising the step of providing a structure on the card to position the flexible printed circuit relative to the card, thereby facilitating alignment of the second contact array with the first contact array.

16. The method of claim 15, wherein the structure further comprises at least two first holes, and the flexible printed circuit includes at least two second holes, the method further comprising the step of aligning the second contact array of the flexible printed circuit with the first contact array by inserting a pin through respective pairs of the first and second holes.

17. An apparatus for electrical coupling, comprising:
   a first contact array on a card, the first contact array being located at a first predefined position relative to an insertion edge of the card;
   first means for positioning a second contact array adjacent to the first contact array, the second contact array corresponding to the first contact array, and the second contact array being positioned in alignment with the first contact array;
   second means for adding a degree of compliance to the second contact array relative to the first contact array, wherein respective contacts in the first array are electrically coupled to corresponding contacts in the second contact array; and
   wherein the insertion edge is configured to be inserted into a receptacle, the second contact array being positioned relative to the insertion edge so as to mate with a corresponding contact array in the receptacle when the insertion edge is inserted into the receptacle.

18. The apparatus of claim 17, wherein the first means further comprises means for reducing an application of a frictional force by the receptacle to the second means when the insertion edge is inserted into the receptacle.

19. The apparatus of claim 18, further comprising:
the first contact array being disposed on a first side of the card;
a third contact array on the card, the third contact array being located at a second predefined position relative to the insertion edge of the card, the third contact array being disposed on a second side of the card;
wherein the first means further comprises means for positioning a fourth contact array adjacent to the third contact array, the fourth contact array corresponding to the third contact array, the fourth contact array being positioned in alignment with the third contact array; and
a third means for adding a degree of compliance to the second contact array relative to the fourth contact array, wherein respective contacts in the third array are electrically coupled to corresponding contacts in the fourth contact array.

20. The apparatus of claim 17, wherein the second means allows the second contact array to conform to a topology of the corresponding contact array in the receptacle when the insertion edge is inserted into the receptacle.

* * * * *